United States Patent
Wan

(10) Patent No.: US 12,302,739 B2
(45) Date of Patent: May 13, 2025

(54) DISPLAY PANEL, MANUFACTURING METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Zhijun Wan, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/772,322

(22) PCT Filed: Apr. 22, 2022

(86) PCT No.: PCT/CN2022/088451
§ 371 (c)(1),
(2) Date: Apr. 27, 2022

(87) PCT Pub. No.: WO2023/197356
PCT Pub. Date: Oct. 19, 2023

(65) Prior Publication Data
US 2024/0147829 A1    May 2, 2024

(30) Foreign Application Priority Data
Apr. 14, 2022  (CN) ......................... 202210393550.9

(51) Int. Cl.
| H10K 71/16 | (2023.01) |
| H10K 50/16 | (2023.01) |
| H10K 50/17 | (2023.01) |
| H10K 59/12 | (2023.01) |
| H10K 71/60 | (2023.01) |

(Continued)

(52) U.S. Cl.
CPC ........... *H10K 71/166* (2023.02); *H10K 50/16* (2023.02); *H10K 50/171* (2023.02);
(Continued)

(58) Field of Classification Search
None
See application file for complete search history.

(56) References Cited

U.S. PATENT DOCUMENTS

2015/0014667 A1* 1/2015 Li .......................... H10K 77/111
                                                                438/46

FOREIGN PATENT DOCUMENTS

| CN | 103325952 A | 9/2013 |
| CN | 105609529 A | 5/2016 |

(Continued)

OTHER PUBLICATIONS

PCT International Search Report for International Application No. PCT/CN2022/088451, mailed on Dec. 15, 2022, 10pp.

(Continued)

*Primary Examiner* — Anthony Ho
(74) *Attorney, Agent, or Firm* — The Roy Gross Law Firm, LLC; Roy D. Gross

(57) ABSTRACT

A display panel, a manufacturing method, and a display device are provided, which includes following steps: providing a substrate; forming a signal terminal located in the non-display region on the substrate; forming a light-emitting layer located in the display region on the substrate; adopting a mask plate to sequentially form an electron layer and a cathode layer on a side of the light-emitting layer away from the substrate, wherein the electron layer at least covers the display region, and the cathode layer covers the electron layer and extends to the non-display region to connect to the signal terminal.

8 Claims, 6 Drawing Sheets

(51) Int. Cl.
*H10K 59/131* (2023.01)
*H10K 59/80* (2023.01)
*H10K 102/00* (2023.01)
*H10K 102/20* (2023.01)

(52) U.S. Cl.
CPC ....... *H10K 59/1201* (2023.02); *H10K 71/164* (2023.02); *H10K 71/60* (2023.02); *H10K 59/131* (2023.02); *H10K 59/875* (2023.02); *H10K 2102/20* (2023.02); *H10K 2102/351* (2023.02)

(56) References Cited

FOREIGN PATENT DOCUMENTS

| CN | 107275522 A | 10/2017 | | |
| CN | 107978691 A | 5/2018 | | |
| CN | 110311056 A | 10/2019 | | |
| CN | 110634917 A | 12/2019 | | |
| CN | 112289945 A | 1/2021 | | |
| CN | 214705977 U | 11/2021 | | |
| CN | 114203778 A | 3/2022 | | |
| CN | 114335403 A | 4/2022 | | |
| EP | 3021364 A1 | * 5/2016 | ........... | G09G 3/3225 |
| JP | 2004214015 A | 7/2004 | | |

OTHER PUBLICATIONS

PCT Written Opinion of the International Search Authority for International Application No. PCT/CN2022/088451, mailed on Dec. 15, 2022, 8pp.

Chinese Office Action issued in corresponding Chinese Patent Application No. 202210393550.9, dated Sep. 14, 2024, pp. 1-7, 15pp.

* cited by examiner

DISPLAY PANEL, MANUFACTURING METHOD THEREOF, AND DISPLAY DEVICE

CROSS REFERENCE TO RELATED APPLICATIONS

This application is a National Phase of PCT Patent Application No. PCT/CN2022/088451 having International filing date of Apr. 22, 2022, which claims the benefit of priority of Chinese Patent Application No. 202210393550.9, filed Apr. 14, 2022, the contents of which are all incorporated herein by reference in their entirety.

BACKGROUND OF INVENTION

Field of Invention

The present application relates to the field of display technology, and particularly relates to a display panel, a manufacturing method thereof, and a display device.

Description of Prior Art

Organic light-emitting diode (OLED) display panels have become the most competitive and potential competitors in future display technology due to their excellent characteristics such as high contrast ratio, wide color gamut, fast response speed, flexibility, etc.

In current stage, evaporation deposition manufacturing processes are generally adopted in organic light emitting diode (OLED) display panels, and strict process requirements and high cost of the OLED display panels limit large-scale popularization and application of this technology in larger-sized products. Furthermore, as inkjet printing technology has been generated and can be executed under a room temperature and an atmospheric pressure, rapid and continuous manufacturing of red, green, and blue pixel arrays on large-size glass substrates creates conditions for manufacturing of large-size OLED displays. However, as the current print technology is in its initial stage, film layers such as hole injection layers, hole transport layers, light-emitting layers, electron transport layers, electron injection layers, cathode layers, and light extraction layers in OLED devices cannot all be manufactured by the printing technology due to material limitations. Wherein, the print display technology can be adopted in the hole injection layer, the hole transport layer, and the light-emitting layer, which avoids a technical difficulty of adopting fine metal mask plates for performing the evaporation deposition during the evaporation deposition process. However, evaporation deposition or sputtering film formation technology are still needed to realize mass production of the electron transport layers, the electron injection layers, the cathode layers, and the light extraction layers.

Because coverage areas of the electron injection layers, the electron transport layers, and the cathode layers are different, mask plates with different opening areas are often required for performing the evaporation deposition processes, which makes the processes be complicated, causing cost increment.

SUMMARY OF INVENTION

Embodiments of the present application provide a display panel, a manufacturing method, and a display device, which are able to use one mask plate to manufacture an electron layer and a cathode layer, simplifies the processes, and reduces cost.

One embodiment of the present application provides a manufacturing method of a display panel. The display panel includes a display region and a non-display region adjacent to the display region. The manufacturing method includes following steps:

providing a substrate;

forming a signal terminal located in the non-display region on the substrate;

forming a light-emitting layer located in the display region on the substrate;

adopting a mask plate to sequentially form an electron layer and a cathode layer on a side of the light-emitting layer away from the substrate, wherein the electron layer at least covers the display region, the cathode layer covers the electron layer and extends to the non-display region to connect to the signal terminal, and wherein the electron layer includes an electron injection layer and/or an electron transport layer.

In one embodiment of the present application, using the mask plate to sequentially form the electron layer and the cathode layer on the side of the light-emitting layer away from the substrate includes following steps:

providing a mask plate, wherein the mask plate includes an opening, a frame body disposed enclosing the opening, and at least one protrusion disposed on the frame body;

disposing the mask plate to align to the substrate, wherein the mask plate is located on a side of the substrate where the signal terminal and the light-emitting layer are disposed, the substrate is located on a side of the mask plate where the protrusion is disposed; and adopting an evaporation deposition process to form the electron layer on a side of the light-emitting layer close to the mask plate.

In one embodiment of the present application, an end of the protrusion away from the frame body is connected to a side of the substrate close to the mask plate to make the mask plate and the side of the substrate close to the mask plate be spaced apart at a position out of the protrusion.

In one embodiment of the present application, using the mask plate to sequentially form the electron layer and the cathode layer on the side of the light-emitting layer away from the substrate further includes following steps:

adopting an evaporation deposition process to form the cathode layer on a side of the electron layer away from the substrate, wherein an evaporation deposition angle of the cathode layer is less than an evaporation deposition angle of the electron layer, and the cathode layer covers the electron layer and at least covers a part of the signal terminal.

In one embodiment of the present application, the cathode layer includes at least one first opening formed in the non-display region, one of the first opening is defined corresponding to one of the protrusion, and an orthogonal projection of the first opening on the substrate does not overlap with an orthogonal projection of the signal terminal on the substrate.

In one embodiment of the present application, the electron layer includes at least one second opening formed in the non-display region, and one of the second opening is defined corresponding to one of the first opening.

In one embodiment of the present application, the manufacturing method of the display panel further includes following steps:

forming a light extraction layer on a side of the cathode layer away from the substrate, and wherein the light extraction layer includes at least one third opening formed in the non-display region, and one of the third opening is defined corresponding to one of the first opening.

In one embodiment of the present application, the evaporation deposition angle of the electron layer is greater than or equal to 45°, the evaporation deposition angle of the cathode layer is less than or equal to 26°, and a height of the protrusion is greater than or equal to 50 μm and is less than or equal to 200 μm.

In one embodiment of the present application, a distance from a boundary of the cathode layer in the non-display region to the display region is less than or equal to 3 mm.

According to the aforesaid purpose of the present application, a display panel is provided. The display panel includes a display region and a non-display region adjacent to the display region.

The display panel further includes:
a substrate;
a signal terminal disposed on the substrate and located in the non-display region;
a light-emitting layer disposed on the substrate and located in the display region;
an electron layer disposed on a side of the light-emitting layer away from the substrate, wherein the electron layer at least covers the display region, and the electron layer includes an electron injection layer and/or an electron transport layer;
a cathode layer disposed on a side of the electron layer away from the light-emitting layer, wherein the cathode layer covers the electron layer and extends to the non-display region to connect to the signal terminal.

In one embodiment of the present application, a distance from a boundary of the cathode layer in the non-display region to the display region is less than or equal to 3 mm.

In one embodiment of the present application, an orthogonal projection of the electron layer on the substrate does not overlap with an orthogonal projection of the signal terminal on the substrate, and the cathode layer at least covers a side of the signal terminal close to the display region.

In one embodiment of the present application, the electron layer further extends to the non-display region and covers a side of the signal terminal close to the display region, and the cathode layer covers a side of the signal terminal away from the display region.

In one embodiment of the present application, a length of the cathode layer covering the signal terminal along a first direction is greater than or equal to 500 μm and is less than or equal to 1000 μm, and the first direction is a direction that the signal terminal pointing to the display region.

In one embodiment of the present application, the cathode layer includes a first sub-section located in the display region and a second sub-section covering the signal terminal, and a thickness of the second sub-section is greater than or equal to 60% of a thickness of the first sub-section.

In one embodiment of the present application, the cathode layer includes at least one first opening defined in the non-display region, and an orthogonal projection of the first opening on the substrate does not overlap with an orthogonal projection of the signal terminal on the substrate.

In one embodiment of the present application, the electron layer includes at least one second opening defined in the non-display region, and one of the second opening is defined corresponding to one of the first opening.

In one embodiment of the present application, the display panel further includes a driving circuit layer disposed between the substrate and the light-emitting layer, the driving circuit layer includes a driving circuit unit disposed in the non-display region, and the orthogonal projection of the first opening on the substrate and an orthogonal projection of the second opening on the substrate do not overlap with an orthogonal projection of the driving circuit unit on the substrate.

In one embodiment of the present application, the display panel further includes a light extraction layer disposed on a side of the cathode layer away from the electron layer, the light extraction layer at least covers the display region and extends to the non-display region, the light extraction layer includes at least one third opening defined in the non-display region, and one of the third opening is defined corresponding to one of the first opening.

According to the aforesaid purpose of the present application, a display device is provided. The display device includes a display panel. The display panel includes a display region and a non-display region adjacent to the display region.

The display panel further includes:
a substrate;
a signal terminal disposed on the substrate and located in the non-display region;
a light-emitting layer disposed on the substrate and located in the display region;
an electron layer disposed on a side of the light-emitting layer away from the substrate, wherein the electron layer at least covers the display region, and the electron layer includes an electron injection layer and/or an electron transport layer;
a cathode layer disposed on a side of the electron layer away from the light-emitting layer, wherein the cathode layer covers the electron layer and extends to the non-display region to connect to the signal terminal.

Compared to the prior art, in the present application, by using one mask plate, manufacture of the electron layer and the cathode layer is completed, thereby simplifying the processes and reducing process cost.

DESCRIPTION OF DRAWINGS

The technical solutions and other advantageous effects of the present application will be apparent with reference to the following accompanying drawings and detailed description of embodiments of the present application.

DETAILED DESCRIPTION OF EMBODIMENTS

Figure 1:
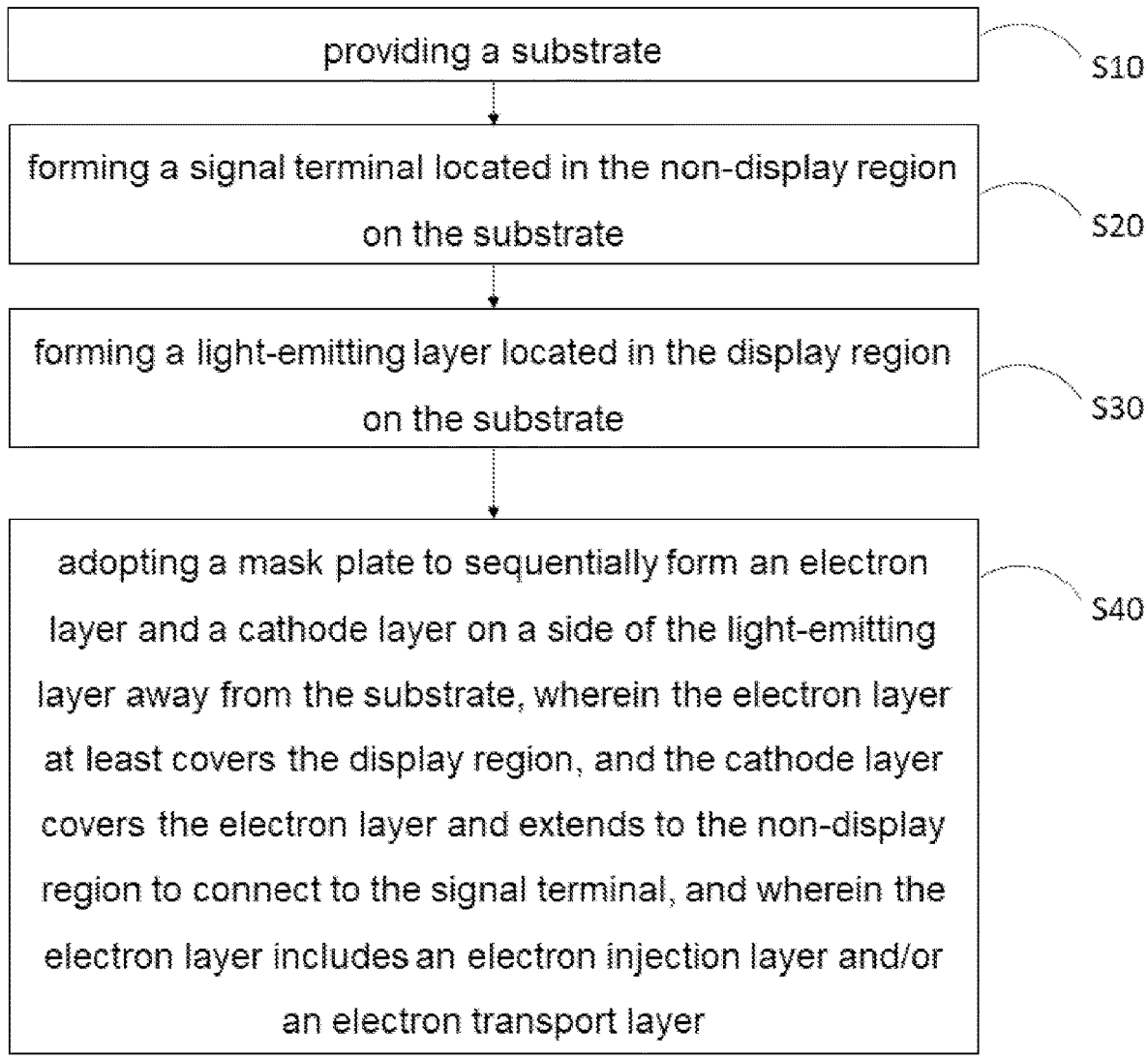
FIG. 1 is a flowchart of a manufacturing method of a display panel provided by one embodiment of the present application.

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application.

The following disclosure provides many different embodiments or examples for implementing the different structures of the present application. In order to simplify the disclosure of the present application, the assemblies and configurations of the specific examples are described below. Of course, they are merely examples and are not intended to limit the present application. In addition, the present application may repeat reference numerals and/or reference numerals in different examples, which are for the purpose of simplicity and clarity, and do not indicate the relationship between the various embodiments and/or arrangements discussed. Moreover, the present application provides embodiments of various specific processes and materials, but one of ordinary skill in the art will recognize the use of other processes and/or the use of other materials.

One embodiment of the present application provides a manufacturing method of a display panel. Please refer to FIG. 1, FIG. 2, and FIG. 3. The display panel includes a display region 101 and a non-display region 102 adjacent to the display region 101. The manufacturing method provided by the embodiment of the present application includes following steps:

S10: providing a substrate 10.

S20: forming a signal terminal 21 located in the non-display region 102 on the substrate 10.

S30: forming a light-emitting layer 30 located in the display region 101 on the substrate 10.

S40: adopting a mask plate 60 to sequentially form an electron layer 40 and a cathode layer 50 on a side of the light-emitting layer 30 away from the substrate 10, wherein the electron layer 40 at least covers the display region 101, and the cathode layer 50 covers the electron layer 40 and extends to the non-display region 102 to connect to the signal terminal 21, and wherein the electron layer 40 includes an electron injection layer and/or an electron transport layer.

During implement application processes, when an organic light emitting diode (OLED) display panel is manufactured, the electron layer and the cathode layer are not suitable for being manufactured by printing technology due to material limitations, and they are often manufactured by evaporation deposition processes. However, as coverage areas of the electron layer and the cathode layer are different, mask plates with different opening areas are often needed for manufacture, which makes the processes be complicated and reduces process cost. In one embodiment of the present application, by using one mask plate 60 to manufacture the electron layer 40 and the cathode layer 50, the electron layer 40 and the cathode layer 50 can be formed only by aligning and attaching in sequence, which simplifies the processes and reduces process cost.

Specifically, please continue referring to FIG. 1, FIG. 2, FIG. 3, and FIG. 4. The manufacturing method of the display panel provided by one embodiment of the present application includes following steps.

S10: providing a substrate 10.

The substrate 10 can include glass substrate, or an organic resin substrate, such as polyimide, etc.

S20: forming a signal terminal located in the non-display region 102 on the substrate 10.

A thin film transistor layer 70 is formed on the substrate 10, and the thin film transistor layer 70 includes a thin film transistor disposed on the substrate 10 and an insulation layer covering the thin film transistor. Wherein, the thin film transistor can include an active layer disposed on the substrate 10, a gate electrode layer disposed on the active layer and insulated, and a source-drain layer disposed on the gate electrode layer and insulated, and the thin film transistor layer 70 further includes signal wirings electrically connected to the thin film transistor. The signal wirings can be disposed in a same layer with the gate electrode layer and the source-drain layer, and specifically can include a gate line, and a data line, etc., which are not limited herein.

A metal electrode layer is formed on the thin film transistor layer 70, and the metal electrode layer is disposed on the source-drain layer and is disposed insulated with the source-drain layer. That is, an organic or inorganic insulation layer can be disposed between the metal electrode layer and the source-drain layer. Specifically, the metal electrode layer includes a plurality of anodes (only one of them is illustrated in FIG. 2 for illustration) disposed in the display region 101 and a signal terminal 21 disposed in the non-display region 102.

Optionally, the metal electrode layer can be a laminated structure of indium tin oxide (ITO)/silver (Ag)/ITO. Wherein, a thickness of the laminated structure is that: a thickness of the ITO layer is greater than or equal to 10 nanometers and less than or equal to 20 nanometers, and a thickness of the Ag layer is greater than or equal to 100 nanometers and less than or equal to 200 nanometers.

It should be noted that in other embodiments of the present application, the signal terminal 21 can also be disposed in the thin film transistor layer 70, specifically in the source-drain layer. In the embodiment of the present application, the signal terminal 21 and the anodes 22 located in a same layer is taken as an example for description, but is not limited thereto.

Figure 2:
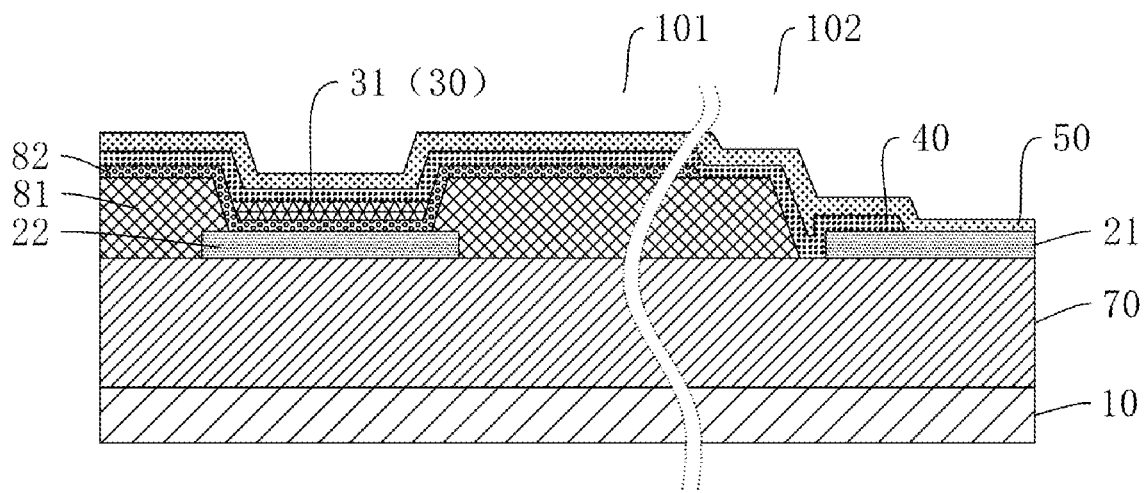
FIG. 2 is a sectional structure schematic diagram of a position where the display panel corresponds to a signal terminal provided by one embodiment of the present application.

A pixel definition layer 81 is formed on a side of the thin film transistor layer 70 and the metal electrode layer away from the substrate 10, the pixel definition layer 81 includes a plurality of pixel openings (only one of which is illustrated in FIG. 2 for illustration) formed in the display area 101, and each pixel opening exposes a surface of one anode 22 away from the thin film transistor layer 70 correspondingly.

S30: forming a light-emitting layer 30 located in the display region 101 on the substrate 10.

A hole layer 82 is formed on a side of the pixel definition layer 81 away from the anodes 22, and the hole layer 82 at least continuously covers the plurality of pixel openings, and covers the anode 22 exposed by each pixel opening. Wherein, the hole layer 82 can include a hole injection layer and a hole transport layer sequentially disposed on the pixel definition layer 81 and the anodes 22.

Optionally, a thickness of the hole injection layer is greater than or equal to 10 nanometers and less than or equal to 30 nanometers, and a thickness of the hole transport layer is greater than or equal to 10 nanometers and less than or equal to 30 nanometers.

The light-emitting layer located in the display region 101 is disposed on the hole layer 82. Wherein, the light-emitting layer 30 includes a plurality of light-emitting units 31 disposed correspondingly in each pixel opening. Wherein, the plurality of light-emitting units 31 can include red light-emitting units, green light-emitting units, and blue light-emitting units. Optionally, a thickness of the red light-emitting units is greater than or equal to 80 nanometers and less than or equal to 150 nanometers; a thickness of the green light-emitting units is greater than or equal to 80 nanometers and less than or equal to 150 nanometers; and a thickness of the blue light-emitting units is greater than or equal to 30 nanometers and less than or equal to 80 nanometers.

S40: adopting a mask plate 60 to sequentially form an electron layer 40 and a cathode layer 50 on a side of the light-emitting layer 30 away from the substrate 10, wherein the electron layer 40 at least covers the display region 101, and the cathode layer 50 covers the display region 101 and extends to the non-display region 102 to connect to the signal terminal 21, and wherein the electron layer 40 includes an electron injection layer and/or an electron transport layer.

Figure 5:
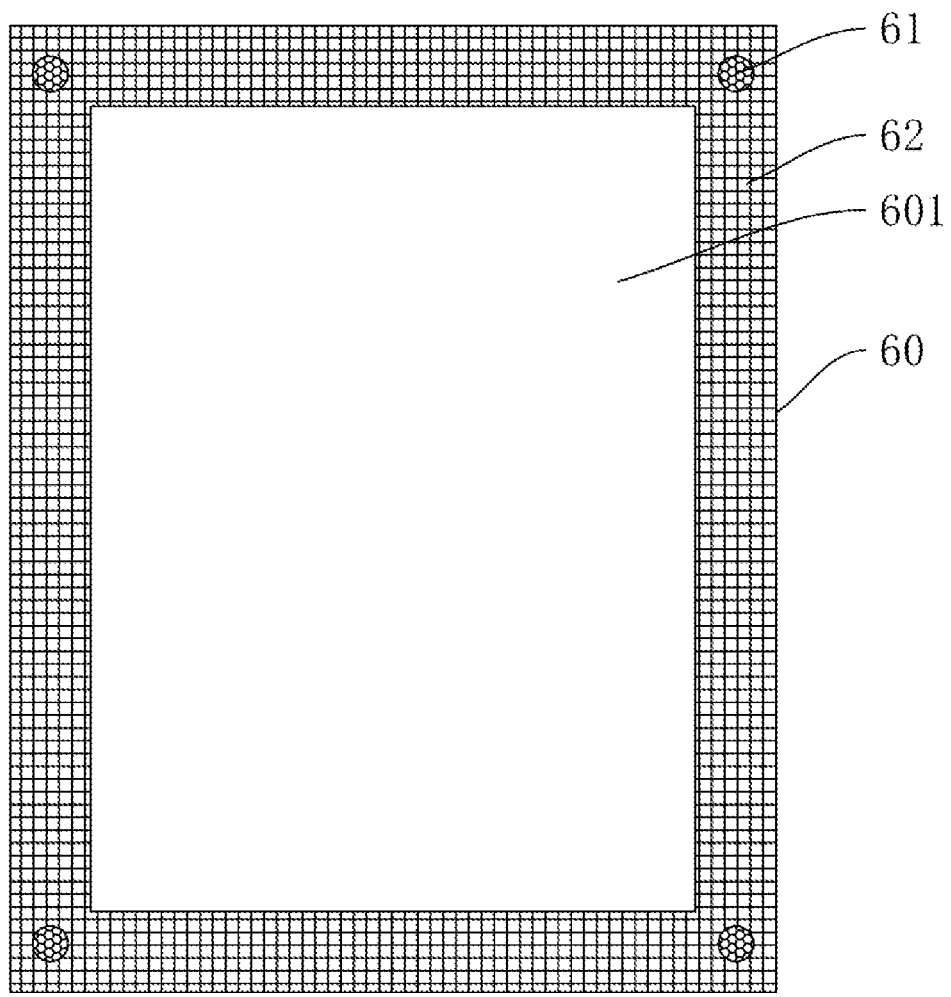
FIG. 5 is a structural schematic diagram of a mask plate provided by one embodiment of the present application.
Figure 6:
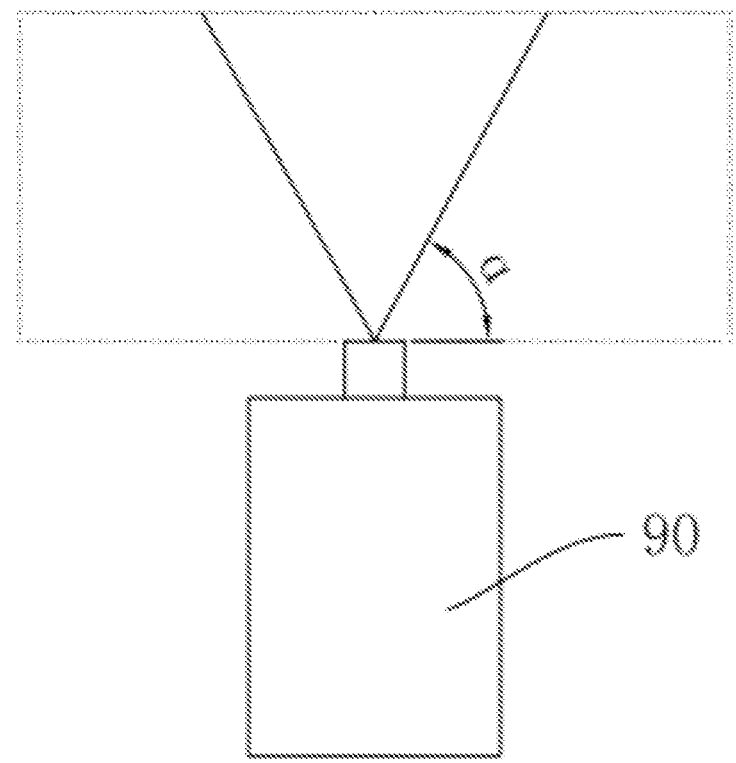
FIG. 6 is a structural schematic diagram of evaporation deposition equipment provided by one embodiment of the present application.

The mask plate 60 is provided, and wherein, as illustrated in FIG. 5, the mask plate 60 includes an opening 601, a frame body 62 disposed enclosing the opening 601, and at least one protrusion 61 disposed on the frame body 62.

It should be noted that the at least one protrusion 61 is located on the same surface as the mask plate 60, i.e., located on the same side of the frame body 62. Furthermore, the surface is a surface which bonded to the panel during performing the evaporation deposition process on the mask plate 60.

The mask plate 60 is disposed to align to the substrate 10, and the mask plate 60 is located on the side of the substrate 10 where the signal terminal 21 and the light-emitting layer 30 are disposed. The substrate 10 is located on the side of the mask plate 60 where the protrusion 61 is disposed. The end of the protrusion 61 away from the frame body 62 is connected to the side of the substrate 10 close to the mask plate 60 to make the mask plate 60 and the substrate 10 be spaced apart at the position out of the protrusion 61, i.e., a hollow space is formed between the mask plate 60 and the substrate 10.

In one embodiment of the present application, the opening 601 of the mask plate 60 can correspond to the display region 101, and an area of the opening 601 can be greater than an area of the display region 101. Therefore, in subsequent evaporation deposition processes, a material of the cathode evaporated and deposited in the non-display region 102 can be ensured.

Optionally, a height of the protrusion 61 is greater than or equal to 50 μm and is less than or equal to 200 μm, a shape of the protrusion 61 can be a conical shape or a conical-frustum shape, and a diameter of the protrusion 61 is greater than or equal to 1 mm and less than or equal to 3 mm, and a distance from the protrusion 61 to a border of the mask plate 60 and a distance from the protrusion 61 to a border of the opening are both greater than or equal to 0.5 mm and less than or equal to 2 mm.

It should be noted that the distance between the mask plate 60 and the substrate 10 can be controlled by controlling the height of the protrusions 61, thereby controlling a film formation coverage area. Furthermore, by controlling a number and a position of the protrusion 61, a supporting effect of the protrusions 61 to the mask plate 60 can be adjusted, while friction between an edge of the mask plate 60 and the substrate 10 can be prevented from damaging the substrate 10. The number and the position of the protrusions 61 provided by the embodiment of the present application provided in FIG. 5 is only an example, but is not limited thereto.

Next, the evaporation deposition process is adopted to form the electron layer 40 on the side of the light-emitting layer 30 close to the mask plate 60.

Optionally, the electron layer 40 can include the electron injection layer and the electron transport layer sequentially disposed on the light-emitting layer 30. Wherein, a material of the electron transport layer includes NaF/LiF, which thickness is greater than or equal to 1 nanometer and less than or equal to 5 nanometers. A material of the electron injection layer includes Yb/Ba, which thickness is greater than or equal to 10 nanometers and less than or equal to 50 nanometers.

In one embodiment of the present application, the electron layer 40 can cover the display region 101 and can partially extend into the non-display region 102, and an orthogonal projection of the electron layer 40 on the substrate 10 can be configured to not overlap with an orthogonal projection of the signal terminal 21 on the substrate 10; or the electron layer 40 can cover a side of the signal terminal 21 close to the display region 101.

Furthermore, when the electron 40 extends into the non-display region 102, as the protrusion 61 on the mask plate 60 is in contact with the side of the substrate 10 close to the mask plate 60, an evaporation deposition material cannot form a film at a contact position between the substrate 10 and the protrusion 61, at least one second opening 401 is formed, i.e., the at least one second opening 401 can be formed in the electronic layer 40 in the non-display region 102, and one second opening 401 is disposed corresponding to one protrusion 61.

It can be understood that it is not the substrate 10 itself in contact with the protrusion 61, but is a film layer on the side of the substrate 10 close to the mask plate 60. For example, in one embodiment of the present application, the film layer in contact with the protrusion 61 can be a portion of the thin film transistor layer 70 located in the non-display region 102; and when the electron layer 40 only covers the display region 101 or the protrusion 61 are located out of a coverage range of the electron layer 40, the second opening 401 will not be formed in the electron layer 40 in the non-display region 102.

The alignment configuration of the mask plate 60 and the substrate 10 are maintained, the cathode layer 50 is formed on the side of the electron layer 40 close to the mask plate 60 by adopting the evaporation deposition process, wherein the cathode layer 50 covers the display region 101 and extends to the non-display region 102 to connect to the signal terminal 21.

In one embodiment of the present application, the cathode layer 50 covers the electron layer 40 and at least covers a part of the signal terminal 21.

Wherein, when the orthogonal projection of the electron layer 40 on the substrate 10 does not overlap with the orthogonal projection of the signal terminal 21 on the substrate 10, the cathode layer 50 covers the electron layer 40 and at least covers the side of the signal terminal 21 close to the display region 101; when the electron layer 40 covers the side of the signal terminal 21 close to the display region 101, the cathode layer 50 covers the electron layer 40 and at least covers the side of the signal terminal 21 away from the display region 101.

It should be noted that at least one first opening 501 can be formed in the cathode layer 50 in the non-display region 102, and wherein one of the first opening 501 is defined corresponding to one protrusion 61. Furthermore, the driving circuit layer 70 includes a driving circuit unit disposed in the non-display region 102, and the orthogonal projections of the first opening 501 and the second opening 401 on the substrate 10 do not overlap with an orthogonal projection of the driving circuit unit on the substrate 10, i.e., during the alignment process of the mask plate 60 and the substrate 10, the protrusions 61 and the driving circuit units are in a staggered configuration to prevent friction damage between the protrusions 61 and the driving circuit units. Similarly, when the protrusion 61 is out of the coverage range of the cathode layer 50, the first opening 501 is not formed in the cathode layer 50 in the non-display region 102.

Figure 3:
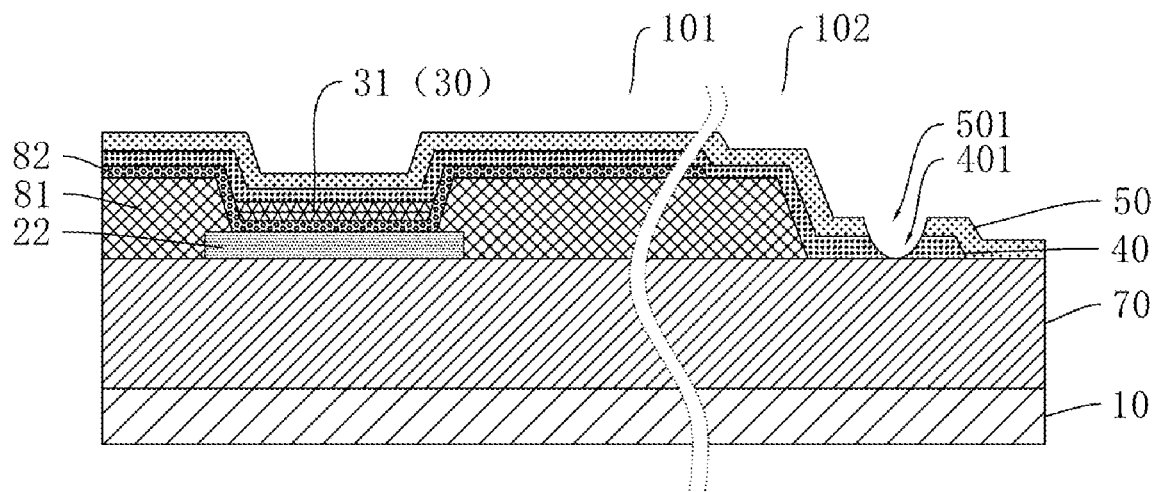
FIG. 3 is a sectional structure schematic diagram of a position where the display panel corresponds to a first opening and a second opening provided by one embodiment of the present application.
Figure 4:
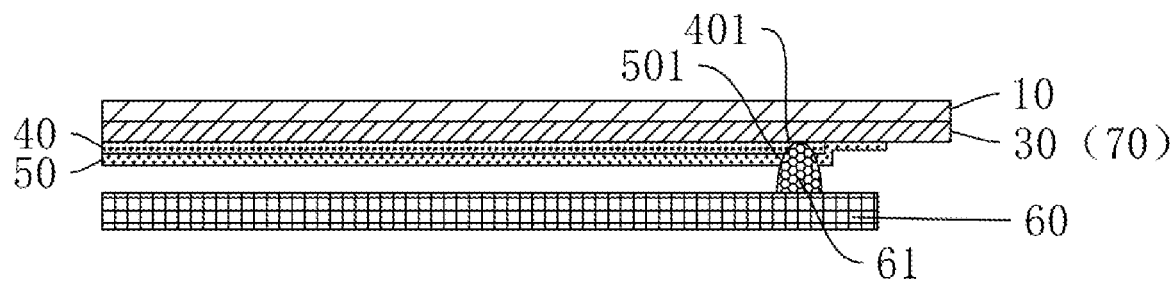
FIG. 4 is a structural schematic diagram of a structure of a process of the display panel provided by one embodiment of the present application.

Please refer to FIG. 3 and FIG. 4. When the electron layer 40 covers the display region 101 and extends into the non-display region 102, the cathode layer 50 covers the light-emitting layer 40, and the protrusion 61 is located in the coverage range of film layers of the electron layer 40 and the cathode layer 50; as the evaporation deposition material at the protrusion 61 cannot form a film, the second opening 401 will be formed in the electronic layer 40 corresponding to the protrusion 61, the first opening 501 will be formed in the cathode layer 50 corresponding to the protrusion 61, and the first opening 501 communicates with the second opening 401 to form a through hole penetrating the electron layer 40 and the cathode layer 50. A sectional shape of the through hole is same as a sectional shape of the protrusion 61.

Optionally, a material of the cathode layer 50 includes silver or an alloy of magnesium and silver, which thickness is greater than or equal to 10 nanometers and less than or equal to 20 nanometers.

Please refer to FIG. 2, FIG. 4, FIG. 5, and FIG. 6. In this embodiment, the evaporation material can be formed on the substrate 10 by an evaporation deposition equipment 90. Wherein, an evaporation deposition angle $\alpha$ of the cathode layer 50 is less than an evaporation deposition angle $\alpha$ of the electron layer 40, i.e., the smaller the evaporation deposition angle $\alpha$ is, the larger the coverage area of the evaporation deposition material is. Because the mask plate 60 and the substrate 10 are spaced apart in the embodiment of the present application, during the evaporation deposition process, a film can be formed from the evaporation deposition material not only at the position corresponding to the opening 601, but can also be at the position between the mask plate 60 and the substrate 10 and extends into the non-display region 102. Furthermore, because the evaporation angle of the cathode layer 50 is smaller, the coverage area of the cathode layer 50 in the non-display region 102 is larger, so as to cover the electron layer 40 and at least part of the signal terminal 21.

Optionally, the evaporation deposition angle $\alpha$ of the cathode layer 50 is less than or equal to 26°, and the evaporation deposition angle of the electron layer 40 is greater than or equal to 45°, and a length of the cathode layer 50 covering the signal terminal 21 along a first direction is greater than or equal to 500 μm and is less than or equal to 1000 μm. Wherein, the first direction is a direction that the signal terminal 21 pointing to the display region 101.

It should be noted that as the electron layer 40 and the cathode layer 50 are manufactured by adopting one mask plate 60 in the embodiment of the present application, and even though the coverage area of the film layer can be controlled by controlling the evaporation deposition angle $\alpha$, however, as the opening area of the mask plate 60 is fixed, the distance between a covering boundary of the electron layer 40 and a covering boundary of the cathode layer 50 is smaller than a distance between the boundaries of an electron layer and a cathode layer manufactured by adopting two mask plates with different opening areas in the related art. Therefore, when the coverage range of the electronic layer 40 is similar, the coverage range of the cathode layer 50 in the embodiment of the present application is smaller, which is more conducive to realizing a narrow bezel of the display panel. In one embodiment of the present application, a distance from a boundary of the cathode layer 50 in the non-display region 102 to the display region 101 is less than or equal to 3 mm. However, in related art, a distance from a boundary of a cathode layer in a non-display region to a display region is more than 4 mm. In this way, the embodiment of the present application can effectively reduce the coverage area of the cathode layer 50, can reduce a bezel width of the display panel, and can realize a narrow bezel of the display panel.

In one embodiment of the present application, the cathode layer 50 includes a first sub-section located in the display region and a second sub-section covering the signal terminal 21, and a thickness of the second sub-section is greater than or equal to 60% of a thickness of the first sub-section to ensure signal transmission effect of the cathode layer 50.

Furthermore, as the connection between the cathode layer 50 and the signal terminal 21 is realized by controlling the evaporation deposition angle to make the evaporation deposition extend to a spaced region between the mask plate 60 and the substrate 10, a formed film thickness of which is smaller than a formed film thickness of a region corresponding to the opening 601 of the mask plate 60. In one embodiment of the present application, the thickness of the portion of the cathode layer 50 corresponding to outside of the opening 601 is greater than or equal to 60% of the thickness of the portion of the cathode layer 50 corresponding to the inside of the opening 601 to ensure the signal transmission effect of the cathode layer 50.

The manufacturing method of the display panel provided by the embodiments of the present application further includes: forming a light extraction layer on a side of the cathode layer 50 close to the mask plate 60, wherein, a method of manufacturing the light extraction layer can include an evaporation deposition process or a sputtering process.

In one embodiment of the present application, at least one third opening can be formed in the light in the non-display region 102, and one of the third opening is disposed corresponding to one protrusion 61.

Optionally, a material of the light extraction layer includes an indium zinc oxide material, and its thickness is greater than or equal to 50 nanometers and less than or equal to 100 nanometers.

Continuing from the above, in the embodiment of the present application, by adopting one mask plate 60, the manufacture of the electron layer 40, the cathode layer 50, and the light extraction layer are sequentially completed.

Therefore, compared to the prior art, which adopts a plurality of mask plates with different opening areas for manufacture, the process is simplified, the process cost is reduced, and the process time is saved. Furthermore, in the present application, by adopting one mask plate 60 to manufacture the electron layer 40 and the cathode layer 50, the distance between the boundary of the electron layer 40 and the boundary of the cathode layer 50 can be effectively reduced, the coverage area of the cathode layer 50 can be controlled, the bezel width of the display panel can be reduced, and the narrow bezel of the display panel can be realized.

Figure 7:
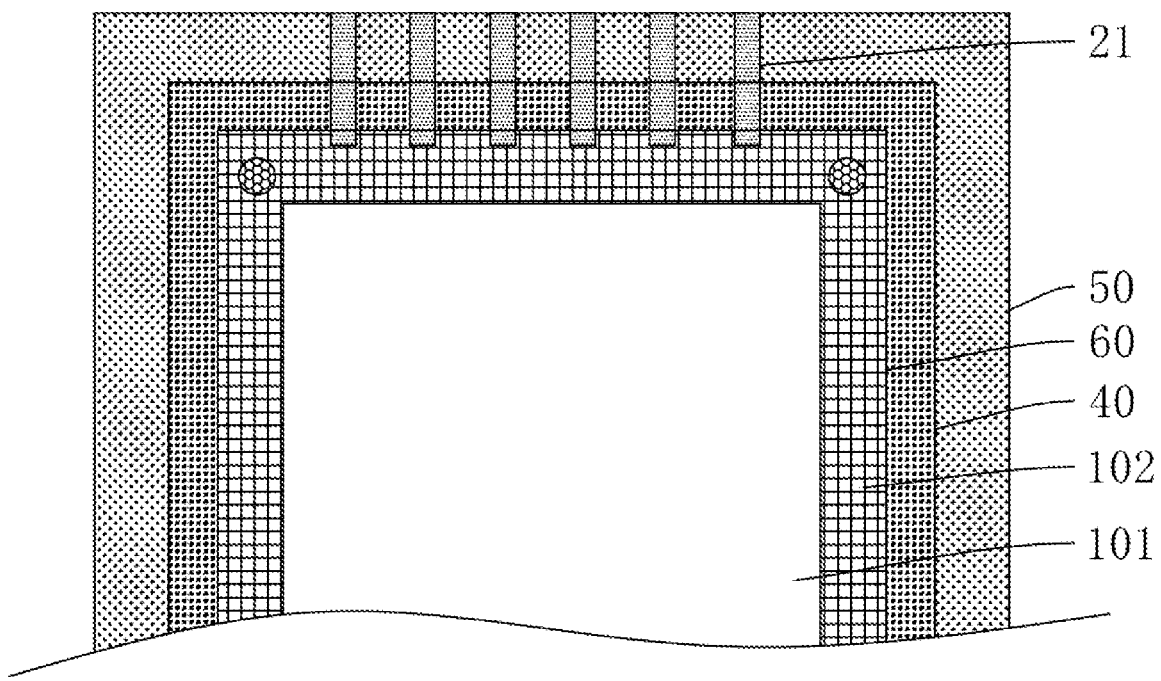
FIG. 7 is a schematic diagram of boundary distribution of the mask plate, an electron layer, and a cathode provided by one embodiment of the present application.
Figure 8:
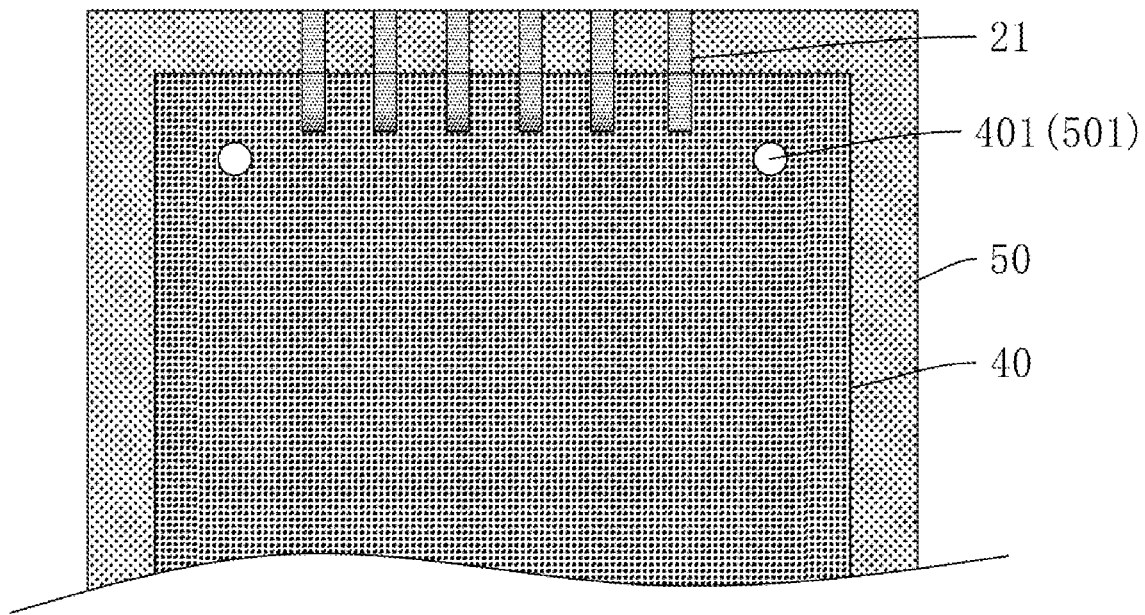
FIG. 8 is a schematic diagram of a boundary distribution of the electron layer and the cathode layer provided by one embodiment of the present application.

In addition, one embodiment of the present application further provides a display panel manufactured by the manufacturing method of the display panel in one of the aforesaid embodiments. Please refer to FIG. 2, FIG. 7, and FIG. 8. The display substrate includes a first display region 101 and a second display region 102 adjacent to the first display region 101.

The display panel further includes a substrate 10, a signal terminal 21, a light-emitting layer 30, an electron layer 40, and a cathode layer 50. Wherein, the signal terminal 21 is disposed on the substrate 10 and located in the non-display region 102; the light-emitting layer 30 is disposed on the substrate 10 and located in the display region 101; the electron layer 40 is disposed on a side of the light-emitting layer 30 away from the substrate 10; the cathode layer 50 is disposed on a side of the electron layer 40 away from the light-emitting layer 30; and the cathode layer 50 covers the display region 101 and extends to the non-display region 102 to connect to the signal terminal 21. Wherein, a distance from a boundary of the cathode layer 50 in the non-display region 102 to the display region 101 is less than or equal to 3 mm.

In an implement application process, the distance from the boundary of the cathode layer 50 in the non-display region 102 to the display region 101 is controlled to be less than 3 mm. Compared to the related art, in which, the distance from a covering boundary of a cathode layer to a display region is greater than 4 mm, the embodiment of the present application can effectively reduce the bezel width of the display panel and realize the narrow bezel of the display panel.

In one embodiment of the present application, please continue referring to FIG. 2, FIG. 3, FIG. 7, and FIG. 8. The display panel includes a substrate 10, a thin film transistor layer 70 disposed on the substrate 10, a metal electrode layer disposed on the thin film transistor layer 70, a pixel definition layer 81 disposed on the metal electrode layer, a hole layer 82 disposed on the pixel definition layer 81, a light-emitting layer 30 disposed on the hole layer 82, an electron layer 40 disposed on the light-emitting layer 30, a cathode layer 50 disposed on the electron layer 40, and a light extraction layer disposed on the cathode layer 50.

Wherein, the substrate 10 can include a glass substrate, or an organic resin substrate, such as polyimide, etc.

The thin film transistor layer 70 includes a thin film transistor disposed on the substrate 10 and an insulation layer covering the thin film transistor. Wherein, the thin film transistor can include an active layer disposed on the substrate 10, a gate electrode layer disposed on the active layer and insulated, a source-drain layer disposed on the gate electrode layer and insulated, and signal wirings electrically connected to the thin film transistor. The signal wirings can be disposed on the the gate electrode layer and the source-drain layer, and specifically can include a gate line, and a data line, etc., which are not limited herein.

The metal electrode layer is disposed on the source-drain layer and is disposed insulated with the source-drain layer, i.e., an organic or inorganic insulation layer can be disposed between the metal electrode layer and the source-drain layer. Specifically, the metal electrode layer includes a plurality of anodes (only one of them is illustrated in FIG. 2 for illustration) disposed in the display region 101 and a signal terminal 21 disposed in the non-display region 102.

The pixel definition layer 81 includes a plurality of pixel openings (only one of which is illustrated in FIG. 2 for illustration) defined in the display area 101, and each pixel opening correspondingly exposes a top surface of one anode 22.

The hole layer 82 at least continuously covers the plurality of pixel openings, and covers the anode 22 exposed by each pixel opening. Wherein, the hole layer 82 can include a hole injection layer and a hole transport layer sequentially disposed on the pixel definition layer 81 and the anodes 22.

The light-emitting layer 30 includes a plurality of light-emitting units 31 disposed correspondingly in each pixel opening. Wherein, the plurality of light-emitting units 31 can include red light-emitting units, green light-emitting units, and blue light-emitting units.

The electron layer 40 can include the electron injection layer and the electron transport layer sequentially disposed on the light-emitting layer 30.

The cathode layer 50 covers the display region 101 and extends to the non-display region 102 to connect to the signal terminal 21, and In one embodiment of the present application, the cathode layer 50 covers the electron layer 40 and at least covers a part of the signal terminal 21.

In one embodiment of the present application, the electron layer 40 covers the display region 101 and extends into the non-display region 102, and the electron layer 40 further covers a side of the signal terminal 21 close to the display region 101. Furthermore, the cathode layer 50 covers the electron layer 40 and covers a side of the signal terminal 21 away from the display region 101

In one embodiment of the present application, the cathode layer 50 can include at least one first opening 501 defined in the non-display region 102, and the electron layer 40 can include at least one second opening 401 defined in the non-display region 102, and one of the first opening 501 is defined corresponding to one of the second opening 401.

In one embodiment of the present application, the light extraction layer is disposed on a side of the cathode layer 50 away from the electron layer 40, and the light extraction layer can cover the display region 101, or cover the display region 101 and extend to the non-display region 102. When the light extraction layer extends into the non-display region 102, the light extraction layer can include at least one third opening defined in the non-display region, and one third opening is defined corresponding to the first opening.

In one embodiment of the present application, a length of the cathode layer 50 covering the signal terminal 21 along a first direction is greater than or equal to 500 μm and is less than or equal to 1000 μm, and the first direction is a direction that the signal terminal 21 pointing to the display region 101. In addition, the cathode layer 50 includes a first sub-section located in the display region and a second sub-section covering the signal terminal 21, and a thickness of the second sub-section is greater than or equal to 60% of a thickness of the first sub-section to ensure a signal transmission effect of the cathode layer 50 and a signal transmission effect between the cathode layer 50 and the signal terminal 21.

Furthermore, the driving circuit layer 70 includes a driving circuit unit disposed in the non-display region 102, and the orthogonal projections of the first opening 501, the second opening 401, and the third opening on the substrate 10 do not overlap with an orthogonal projection of the driving circuit unit on the substrate 10.

Figure 9:
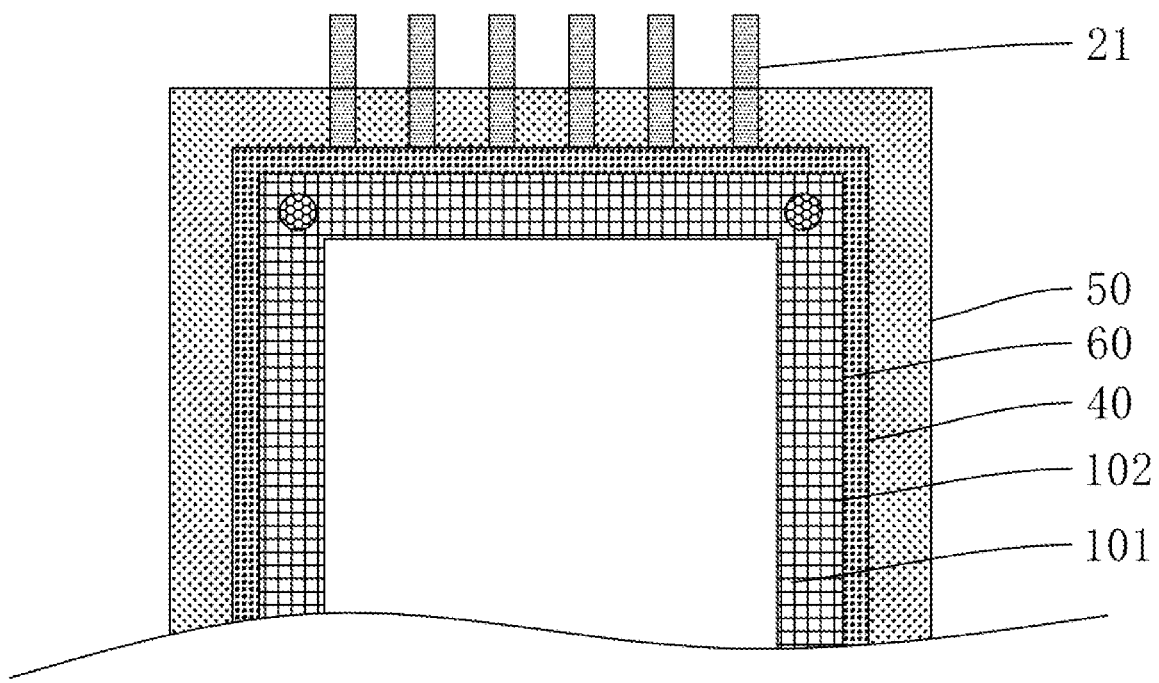
FIG. 9 is a schematic diagram of another boundary distribution of the mask plate, the electron, and the cathode layer provided by one embodiment of the present application.
Figure 10:
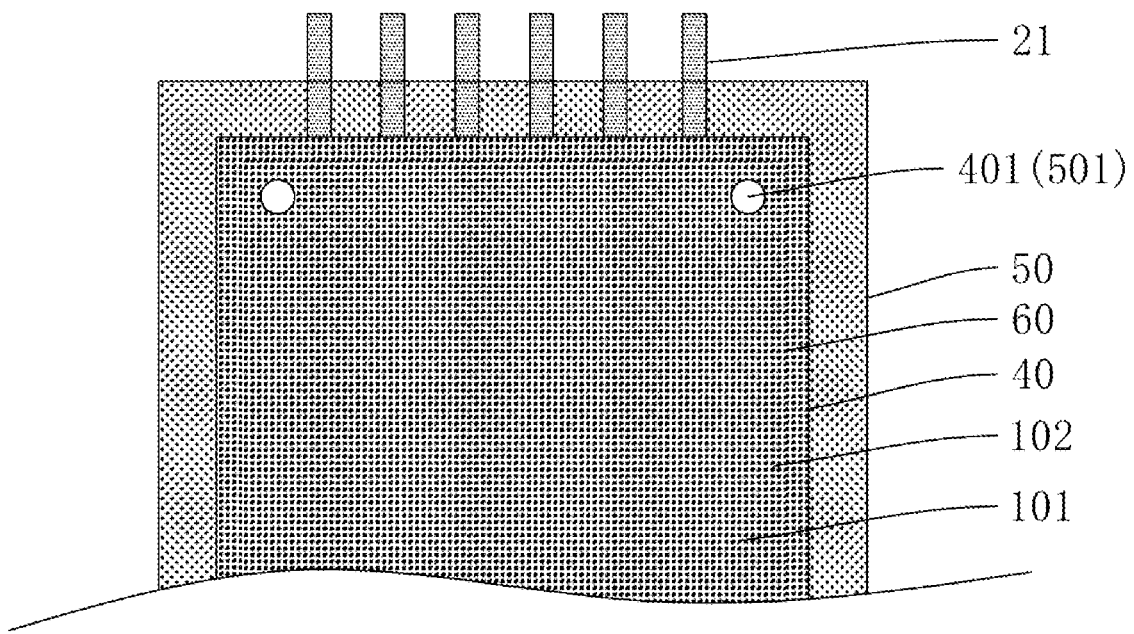
FIG. 10 is a schematic diagram of another boundary distribution of the electron layer and the cathode layer provided by one embodiment of the present application.

In another embodiment of the present application, please refer to FIG. 3, FIG. 9, and FIG. 10, the difference from the previous embodiment is that: the electron layer 40 covers the display region 101 and partially extends into the non-display region 102, and the orthogonal projection of the electron layer 40 on the substrate 10 does not overlap with the orthogonal projection of the signal terminal 21 on the substrate, furthermore, the cathode layer 50 covers the electron layer 40 and at least covers a side of the signal terminal 21 close to the display region 101.

It should be noted that in other embodiments of the present application, the electronic layer 40 can be located only in the display region 101, the cathode layer 50 can also cover a middle position of the signal terminal 21, or by controlling the evaporation deposition angle of the cathode layer 50, the cathode layer 50 is allowed to cover all the signal terminal 21 to make a contact area between the cathode layer 50 and the signal terminal 21 be maximized.

In addition, one embodiment of the present application further provides a mask plate used in the manufacturing method of the display panel in the aforesaid embodiments. Please refer to FIG. 5. The mask plate 60 includes an opening 601, a frame body 62 disposed enclosing the opening 601, and at least one protrusion 61 disposed on the frame body 62. Wherein, the at least one protrusion 61 is located on a same side as the mask plate 60, i.e., located on a same side of the frame body 62, which is a side in contact with the panel.

Optionally, the mask plate 60 includes four protrusions, which are located at four corners of the mask plate 60. A number of the protrusions 61 can also be increased or decreased according to actual requirement, which is not limited herein. In addition, a height of the protrusion 61 is greater than or equal to 50 μm and is less than or equal to 200 μm, a shape of the protrusion 61 can be a conical shape or a conical-frustum shape, and a diameter of the protrusion 61 is greater than or equal to 1 mm and less than or equal to 3 mm, and a distance from the protrusion 61 to a border of the mask plate 60 and a distance from the protrusion 61 to a border of the opening are both greater than or equal to 0.5 mm and less than or equal to 2 mm.

In addition, one embodiment of the present application further provides a display device. The display device includes the display panel manufactured by adopting the manufacturing method of the display panel described in the aforesaid embodiments or the display panel in the aforesaid embodiments.

In summary, in the embodiments of the present application, by using one mask plate 60 to manufacture the electron layer 40 and the cathode layer 50, the electron layer 40 and the cathode layer 50 can be formed only by aligning and attaching in sequence, which simplifies the processes and reduces process cost. In one embodiment of the present disclosure, a distance from a boundary of the cathode layer 50 in the non-display region 102 to the display region 101 is less than or equal to 3 mm. Compared to the related art, in which, the distance from a covering boundary of a cathode layer to a display region is greater than 4 mm. Therefore, the embodiments of the present application can effectively reduce the coverage area of the cathode layer 50, can effectively reduce the bezel width of the display panel, and can realize the narrow bezel of the display panel.

In the above embodiments, the description of each embodiment has its emphasis, and for some embodiments that may not be detailed, reference may be made to the relevant description of other embodiments.

The display panel, the manufacturing method thereof, and the display device provided by the embodiments of present application are described in detail above. This article uses specific cases for describing the principles and the embodiments of the present application, and the description of the embodiments mentioned above is only for helping to understand the method and the core idea of the present application. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present application.

What is claimed is:

1. A manufacturing method of a display panel, wherein the display panel comprises a display region and a non-display region adjacent to the display region, and the manufacturing method comprises following steps:
   providing a substrate;
   forming a signal terminal located in the non-display region on the substrate;
   forming a light-emitting layer located in the display region on the substrate;
   adopting a mask plate to sequentially form an electron layer and a cathode layer on a side of the light-emitting layer away from the substrate,
   wherein the electron layer at least covers the display region, the cathode layer covers the electron layer and extends to the non-display region to connect to the signal terminal, and wherein the electron layer comprises at least one of an electron injection layer or an electron transport layer;
   wherein using the mask plate to sequentially form the electron layer and the cathode layer on the side of the light-emitting layer away from the substrate comprises following steps:
   providing the mask plate, wherein the mask plate comprises an opening, a frame body disposed enclosing the opening, and at least one protrusion disposed on the frame body;
   disposing the mask plate to align to the substrate, wherein the mask plate is located on a side of the substrate where the signal terminal and the light-emitting layer are disposed, the substrate is located on a side of the mask plate where the protrusion is disposed; and
   adopting an evaporation deposition process to form the electron layer on a side of the light-emitting layer close to the mask plate.

2. The manufacturing method of the display panel as claimed in claim 1, wherein an end of the protrusion away from the frame body is connected to a side of the substrate close to the mask plate to make the mask plate and the side of the substrate close to the mask plate be spaced apart at a position out of the protrusion.

3. The manufacturing method of the display panel as claimed in claim 1, wherein using the mask plate to sequentially form the electron layer and the cathode layer on the side of the light-emitting layer away from the substrate comprises following steps:

adopting an evaporation deposition process to form the cathode layer on a side of the electron layer away from the substrate, wherein an evaporation deposition angle of the cathode layer is less than an evaporation deposition angle of the electron layer, and the cathode layer covers the electron layer and at least covers a part of the signal terminal.

4. The manufacturing method of the display panel as claimed in claim 3, wherein the cathode layer comprises at least one first opening formed in the non-display region, one of the first opening is defined corresponding to one of the protrusion, and an orthogonal projection of the first opening on the substrate does not overlap with an orthogonal projection of the signal terminal on the substrate.

5. The manufacturing method of the display panel as claimed in claim 4, wherein the electron layer comprises at least one second opening formed in the non-display region, and one of the second opening is defined corresponding to one of the first opening.

6. The manufacturing method of the display panel as claimed in claim 4, wherein the manufacturing method of the display panel comprises following steps:

forming a light extraction layer on a side of the cathode layer away from the substrate, and wherein the light extraction layer comprises at least one third opening formed in the non-display region, and one of the third opening is defined corresponding to one of the first opening.

7. The manufacturing method of the display panel as claimed in claim 3, wherein the evaporation deposition angle of the electron layer is greater than or equal to 45°, the evaporation deposition angle of the cathode layer is less than or equal to 26°, and a height of the protrusion is greater than or equal to 50 μm and is less than or equal to 200 μm.

8. The manufacturing method of the display panel as claimed in claim 1, wherein a distance from a boundary of the cathode layer in the non-display region to the display region is less than or equal to 3 mm.

\* \* \* \* \*